(12) United States Patent
Rinzler et al.

(10) Patent No.: US 9,331,217 B2
(45) Date of Patent: May 3, 2016

(54) ELECTRONIC GATE ENHANCEMENT OF SCHOTTKY JUNCTION SOLAR CELLS

(75) Inventors: Andrew Gabriel Rinzler, St. Newberry, FL (US); Pooja Wadhwa, Chandler, AZ (US); Jing Guo, Gainesville, FL (US); Gyungseon Seol, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 0 days.

(21) Appl. No.: 13/580,205

(22) PCT Filed: Apr. 27, 2011

(86) PCT No.: PCT/US2011/034107
§ 371 (c)(1),
(2), (4) Date: Aug. 21, 2012

(87) PCT Pub. No.: WO2011/139754
PCT Pub. Date: Nov. 10, 2011

(65) Prior Publication Data
US 2012/0312371 A1 Dec. 13, 2012

(51) Int. Cl.
*H01L 31/0224* (2006.01)
*H01L 31/07* (2012.01)

(52) U.S. Cl.
CPC ........ *H01L 31/022433* (2013.01); *H01L 31/07* (2013.01); *Y02E 10/50* (2013.01)

(58) Field of Classification Search
CPC ... H01L 31/0033; H01L 31/07; H01L 31/108; H01L 31/1085; H01L 31/1121
USPC .................................................. 136/256, 255
See application file for complete search history.

(56) References Cited

U.S. PATENT DOCUMENTS

| 4,215,185 A | 7/1980 | Williams |
| 4,388,383 A * | 6/1983 | Heller ........................... 429/111 |

(Continued)

FOREIGN PATENT DOCUMENTS

| CN | 1122520 A | 5/1996 |
| CN | 101292365 A | 10/2008 |

(Continued)

OTHER PUBLICATIONS

Merriam Webster, Mesh, Merriam Webster Free Dictionary.*

(Continued)

*Primary Examiner* — Eli Mekhlin
*Assistant Examiner* — Bethany L Martin
(74) *Attorney, Agent, or Firm* — Wolf, Greenfield & Sacks, P.C.

(57) ABSTRACT

Various systems and methods are provided for Schottky junction solar cells. In one embodiment, a solar cell includes a mesh layer formed on a semiconductor layer and an ionic layer formed on the mesh layer. The ionic layer seeps through the mesh layer and directly contacts the semiconductor layer. In another embodiment, a solar cell includes a first mesh layer formed on a semiconductor layer, a first metallization layer coupled to the first mesh layer, a second high surface area electrically conducting electrode coupled to the first metallization layer by a gate voltage, and an ionic layer in electrical communication with the first mesh layer and the second high surface area electrically conducting electrode. In another embodiment, a solar cell includes a grid layer formed on a semiconductor layer and an ionic layer in electrical communication with the grid layer and the semiconductor layer.

20 Claims, 11 Drawing Sheets

(56) References Cited

U.S. PATENT DOCUMENTS

| | | | |
|---|---|---|---|
| 4,806,496 A * | 2/1989 | Suzuki et al. | 438/12 |
| 5,082,505 A * | 1/1992 | Cota et al. | 136/253 |
| 5,283,207 A * | 2/1994 | Haga et al. | 438/96 |
| 2006/0260674 A1* | 11/2006 | Tran | 136/252 |
| 2007/0107765 A1* | 5/2007 | Schutten et al. | 136/243 |
| 2008/0083454 A1* | 4/2008 | Park et al. | 136/258 |
| 2008/0110491 A1 | 5/2008 | Bueller et al. | |
| 2008/0276987 A1 | 11/2008 | Flood | |
| 2008/0308151 A1* | 12/2008 | Den Boer et al. | 136/256 |
| 2009/0057650 A1 | 3/2009 | Lieber et al. | |
| 2009/0194160 A1 | 8/2009 | Chin et al. | |
| 2009/0211633 A1* | 8/2009 | Schilinsky et al. | 136/256 |
| 2010/0012166 A1* | 1/2010 | Yamanaka et al. | 136/244 |
| 2010/0078066 A1 | 4/2010 | Darling et al. | |
| 2010/0206362 A1* | 8/2010 | Flood | 136/252 |

FOREIGN PATENT DOCUMENTS

| | | |
|---|---|---|
| CN | 101694816 A | 4/2010 |
| JP | S58-4984 A | 1/1983 |
| JP | 2006-210139 A | 8/2006 |
| JP | 2007-113365 A | 5/2007 |
| RU | 77505 U1 | 10/2008 |
| WO | WO 2006-015431 A1 | 2/2006 |
| WO | WO 2009/013942 A1 | 1/2009 |
| WO | 2009141595 A2 | 11/2009 |

OTHER PUBLICATIONS

Brooklyn College, Interface Dipole, Brooklyn College.*
Wikipedia, Electrical Resistivity and Conductivity, Wikipedia, the free encyclopedia.*
Shu et al, Hybrid Heterojunction and Photoelectrochemistry Solar Cell Based on Silicon Nanowires and Double-Walled Carbon Nanotubes, Nano Letters, 2009, pp. 4338-4342.*
Wu et al, Electrolytes in Dye-Sensitized Solar Cells, Chemical Reviews, vol. 115 pp. 2136-2173.*
The International Preliminary Report on Patentability dated Nov. 8, 2012.
The International Search Report and Written Opinion dated Dec. 15, 2011.
Zhou, et al., "Heterojunction Photovoltaic Devices Utilizing Single Wall Carbon Nanotube Thin Films and Silicon Substrates," 2008 IEEE.
Wei, et al., "Double-Walled Carbon Nanotube Solar Cells," Nano Letters, pp. A-E, Jul. 3, 2007.
Jia, et al., "Nanotube-Silicon Heterojunction Solar Cells," Advanced Materials, 2008, 20, pp. 4594-4598.
Japanese Office Action and English translation thereof dated Oct. 7, 2014 in connection with Application No. 2013-508201.
Chinese Office Action and English translation thereof dated Dec. 29, 2014 in connection with Application No. 201180018487.0.

* cited by examiner

FIG. 2A  FIG. 2B

ELECTRONIC GATE ENHANCEMENT OF SCHOTTKY JUNCTION SOLAR CELLS

STATEMENT AS TO FEDERALLY SPONSORED RESEARCH

The invention was made with government support under agreement ECCS-0824157 awarded by the National Science Foundation. The U.S. government has certain rights in the invention.

CROSS REFERENCE TO RELATED APPLICATIONS

This application is the 35 U.S.C. §371 national stage of PCT application PCT/US2011/034107, filed Apr. 27, 2011, which claims priority to and the benefit of U.S. provisional application entitled "ELECTRONIC GATE ENHANCEMENT OF SCHOTTKY JUNCTION SOLAR CELLS" having Ser. No. 61/328,417, filed Apr. 27, 2010, both of which are hereby incorporated by reference in their entirety.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Solar cells are useful for converting sunlight into energy. The present disclosure describes solar cells including a nanotube film-semiconductor junction, which has a built-in potential that is not merely a function of material properties but also can be modified by electronic gating. Additionally, electronic gating can modify the interface dipole at the junction between the nanotube film and the semiconductor, reducing barriers to charge transport across the junction. Furthermore, the electronic gating can contribute to the electric field across the depletion layer enhancing the efficiency with which charges are swept out of the region further boosting the power generation capabilities.

Figure 1:
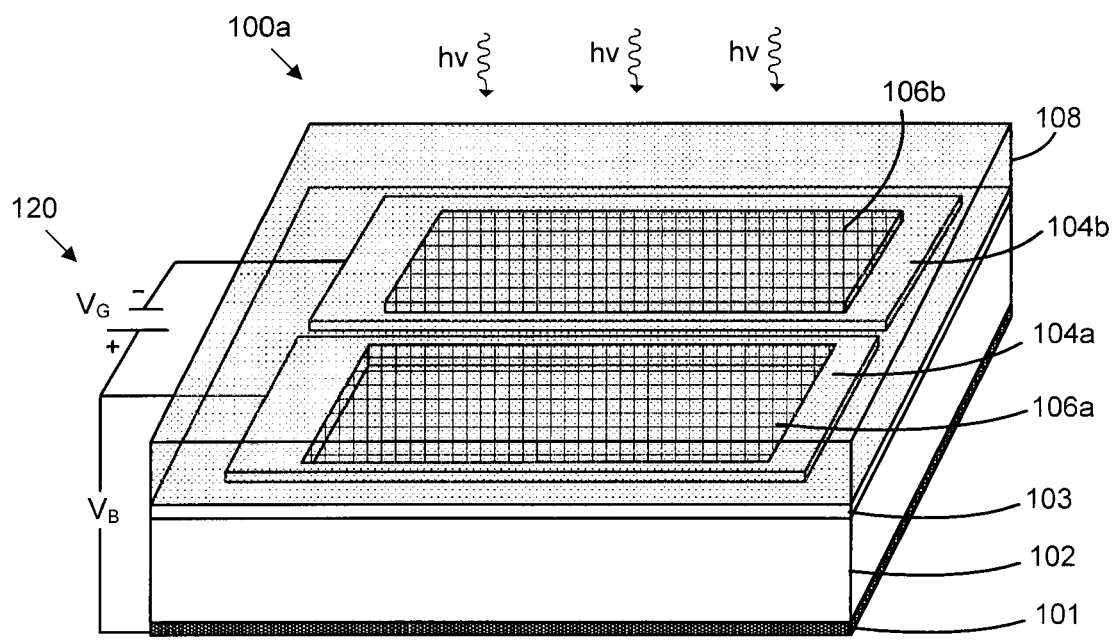
FIG. 1 is a graphical representation of an example of a solar cell in accordance with various embodiments of the present disclosure.

FIG. 1 is a perspective view of a nonlimiting embodiment, among others, of a solar cell 100, denoted as solar cell 100a. Solar cell 100a is helpful for demonstrating the functionality of the various embodiments described herein. Embodiments of solar cells 100 more useful in commercial applications are described in detail below. The solar cell 100a includes a back contact layer 101 and a semiconductor layer 102. The solar cell 100a further includes an insulating layer 103 on the semiconductor layer 102. A portion of the insulating layer 103 is etched to expose the semiconductor layer 102, which is surrounded by a first metallization layer 104a. A first mesh layer 106a is placed on the etched portion such that the first mesh layer 106a contacts the semiconductor layer 102 and the first metallization layer 104a. The first mesh layer 106a is an electrically conducting, porous mesh layer transparent to an appreciable fraction of the solar radiance spectrum.

The solar cell 100a further includes a second metallization layer 104b on the insulating layer 103. A second mesh layer 106b contacts the second metallization layer 104b. However, in other embodiments of a solar cell 100, no insulating layer 103, no second metallization layer 104b and no second mesh layer 106b is included.

The mesh layers 106a and 106b are electrically isolated from each other. The first metallization layer 104a forms a contact for the first mesh layer 106a, and the second metallization layer 104b forms a contact for the second mesh layer 106b. Also, the first mesh layer 106a contacts the semiconductor layer 102 whereas the second mesh layer 106b is isolated from the semiconductor layer 102 by the insulating layer 103. The first mesh layer 106a and first metallization layer 104a collectively form a junction electrode. Similarly, the second mesh layer 106b and the second metallization layer 104b collectively form a gate electrode.

In the solar cell 100a depicted in FIG. 1, the first mesh layer 106a and the second mesh layer 106b are approximately the same size and, thus, have comparable surface areas. However, in other embodiments, the first mesh layer 106a and the second mesh layer 106b may be different shapes but have similar surface areas. Also, in embodiments of a solar cell 100 where no second mesh layer 106b is included, the junction electrode and the remote gate electrode have approximately the same surface areas.

An ionic conductor layer 108 covers at least a portion of each of the following layers: the first mesh layer 106a, the second mesh layer 106b, the first metallization layer 104a, the second metallization layer 104b, and the insulating layer 103. The ionic conductor layer 108 also seeps down through the first mesh layer 106a and also directly contacts the semiconductor layer 102. The first metallization layer 104a and the second metallization layer 104b are biased by a voltage source 120 at a gate voltage $V_G$.

In operation, a solar cell 100 is a source of power. The solar cell 100a illustrated in FIG. 1 generates power when the surface of the semiconductor layer 102 is illuminated by solar radiation. Specifically, solar radiation (hv) passing through the ionic conductor layer 108 and through the first mesh layer 104a causes an accumulation of charge on the first metallization layer 104a and the opposite charge on the back contact layer 101. Under illumination, the potential difference between the first metallization layer 104a and the back contact layer 101 when no resistive load is electrically connected to the first metallization layer 104a and the back contact layer 101 is called the open circuit voltage $V_{OC}$.

When a resistive load that is capable of consuming power is electrically connected to the first metallization layer 104a and the back contact layer 101, a current will flow through the load. Once current flows through the load, the voltage between the first metallization layer 104a and the back contact layer 101 will decrease. The product of the voltage across the load and the current flowing through the load is the power dissipated by the load and is also the power being generated by the solar cell 100a. For fixed illumination of the solar cell 100a, a plot of the current through the load versus the voltage across the load, as the load resistance changes permits extraction of the figures of merit that characterize the performance of the solar cell 100a. Alternatively, a sourcemeter can apply bias voltages between the first metallization layer 104a and the back contact layer 101, while measuring the current. A plot of this current versus the applied bias voltage also permits extraction of the figures of merit that characterize the performance of the solar cell 100a.

Having described the structure and power generaing capabilities of the solar cell 100a in the embodiment in FIG. 1, various materials that may be included in the layers of the solar cell 100a will be described. The semiconductor layer 102 includes one or more of the following semiconductor materials: Si, Ge, and/or GaAs, CdS, ZnO, CdSe, $TiO_2$. The semiconductor material is doped, and in some embodiments the semiconductor material is n-type Si.

The back contact layer 101 includes one or more metals and/or an alloy thereof that forms a low resistance Ohmic contact with the semiconductor layer 102. When the semiconductor layer 102 includes lightly doped n-Si, the back contact layer 101 may include, for example, titanium, aluminum, and/or indium gallium eutectic. Alternatively, the back side of the semiconductor layer 102 (i.e., the side of the semiconductor layer 102 that contacts the back contact layer 101) may be heavily doped, in which case most metals will form suitable low resistance contacts.

In embodiments that include an insulating layer 103, such as the solar cell 100a depicted in FIG. 1, the insulating layer 103 may include an insulating material such as silicon dioxide (SiQ). As will be discussed in further detail, some embodiments do not include an insulating layer 103.

Similarly, the first metallization layer 104a and the second metallization layer 104b of the solar cell 100a illustrated in FIG. 1 may include one or more of the following conductive materials: chromium (Cr), gold (Au), palladium (Pd), and indium tin oxide (ITO). However, as will be discussed in further detail below, some embodiments of a solar cell 100 do not include metallization layers 104a, 104b.

The first mesh layer 106a (and the second mesh layer 106b in embodiments that include a second mesh layer 106b) includes one or more of the following materials: single wall carbon nanotubes, double wall carbon nanotubes, multi-wall carbon nanotubes, graphene, semiconducting nanowires, metallic nanowires, a metallic grid or a semiconducting grid. Regardless of the material, the first mesh layer 106a, which is in contact with the semiconductor layer 102, is sufficiently transparent to the solar radiation that the major fraction of the radiation reaches the surface of the semiconductor layer 102. Furthermore, the first mesh layer 106a is electrically conducting with a sheet resistance of about 300 Ohms/sq or less. Additionally, the first mesh layer 106a is sufficiently porous to permit access of the ionic conductor layer 108 to both the surface of the semiconductor layer 102 and the portions of the first mesh layer 106a that contact the surface of the semiconductor layer 102.

For example, in the embodiment of a solar cell 100a illustrated in FIG. 1, the first mesh layer 106a and the second mesh layer 106b each include a network of nanotubes. Because the first mesh layer 106a and the second mesh layer 106b include a network of nanotubes, the first mesh layer 106a and the second mesh layer 106b are porous and transparent. Nanotubes have a low density of states but a high conductivity. The Fermi level of nanotubes can also be adjusted by doping using an electron acceptor or an electron donor. It can be energetically favorable for carbon to donate an electron or accept an electron to form an ionic bond. Accordingly, in some embodiments, the first mesh layer 106a and/or the second mesh layer 106b is p-doped using electron acceptors such bromine, thionyl chloride, or nitric acid. Further, the first mesh layer 106a and/or the second mesh layer 106b may be roughly a third metallic and the remaining two thirds semiconducting, but with doping of semiconducting nanotubes, they become conductive enough to be considered as effectively all metallic.

The ionic conductor layer 108 includes an ionically conducting material. This ionically conducting material possesses a high ionic conductivity and is transparent to an appreciable fraction of the solar irradiance spectrum. For example, the ionically conducting material may be an ionic liquid, an electrolyte solution, or a solid state electrolyte. In some embodiments, the ionic liquid is 1-Ethyl-3-methylimidazolium bis(trifluoromethylsulfonyl)imide (EMI-BTI). The voltage applied by the gate voltage 120 remains below the reduction-oxidation (redox) potential of the ionically conducting material to avoid electro-chemical alteration of the properties of the ionically conducting material.

Referring to the solar cell 100a illustrated in FIG. 1, at steady state, the voltage applied by the gate voltage 120 to the metallization layers 104a, 104b will inject charge of opposite sign onto the mesh layers 106a and 106b. For example, if 0.5 V is applied between the first mesh layer 106a and the second mesh layer 106b while the second mesh layer 106b is made negative, then electrons will be with drawn from the nanotubes in the first mesh layer 106a (leaving the first mesh layer 106a positively charged) while the second mesh layer 106b will have electrons injected, making it negatively charged. In the absence of the ionic conductor layer 108, the capacitance of this arrangement is rather small so that not much charge can be removed from the first mesh layer 106a and put onto the second mesh layer 106b.

The Coulombic attraction of the positive charge induced on the first mesh layer 106a for the remaining electrons on the first mesh layer 106a is too strong for more electrons to be removed by the power supply at this voltage. When the ionic conductor layer 108 is present, however, the capacitance becomes much larger so that much more charge can be removed from the first mesh layer 106a, to be put onto the second mesh layer 106b at this same voltage. This occurs because in response to the initial positive charge left on the first mesh layer 106a, negative ions from the ionic conductor layer 108 migrate to the surfaces of the nanotubes. These negative ions compensate the Coulombic attraction of the positive charge on the nanotubes for its remaining electrons allowing the power supply to withdraw more electrons from the first mesh layer 106a at this same voltage. Positive ions attracted to the negative charge on the second mesh layer 106b similarly allows many more electrons to be injected onto the nanotubes in that layer. The presence of the ionically conducting material thus permits appreciable changes in the electronic population of the nanotubes in the mesh layers 106a, 106b. Because a charge transfer dopant similarly changes the electronic population of a nanotube this can be considered an electronic doping of the nanotubes. The change in their electronic populations causes the Fermi level of the mesh layers 106a, 106b to change. The charges on the nanotubes do not come from the ionic conductor layer 108, but rather from the power supply 120, however the ionic conductor layer 108 allows the charges to accumulate on the mesh layers 106a, 106b. Therefore, the embodiment of a solar cell 100a illustrated in FIG. 1 is a device that enables changing the Fermi level of a nanotube layer electronically.

As mentioned above, the voltage applied by the gate voltage 120 remains below the reduction-oxidation (redox) potential of the ionically conducting material of the ionic conductor layer 108, and therefore, no current flows at steady state (once charge reorganization has settled). This means that under steady operation, the applied gate voltage neither consumes nor supplies power. In other words, since power is equal to the product of current and voltage, there is no power drawn because there is no current flowing. The embodiment of a solar cell 100a illustrated in FIG. 1 has a power conversion efficiency of about 11%.

Various embodiments of the solar cell 100, including solar cell 100a, include a metal to semiconductor junction. For example, the first mesh layer 106a and the semiconductor layer 102 form a metal to semiconductor junction. FIGS. 2A and 2B are energy band diagrams showing the energy levels of the metal and the semiconductor before (FIG. 2A) and after (FIG. 2B) the metal and semiconductor are placed into contact. FIGS. 2A and 2B are simplified pictures that ignore (for the moment) surface states existing or induced at the surface of the semiconductor. The Fermi levels in the metal and semiconductor characterize their average highest filled electronic energy states in isolation.

A workfunction $\phi$ corresponds to the energy required to take an electron from the Fermi level to vacuum far from the material. The case shown is the one where the workfunction of the metal possesses a workfunction, $\phi_M$, relative to the workfunction of the semiconductor for which $|\phi_M|>|\phi_S|$. This is relevant to the junction between the first mesh layer 106a and the semiconductor layer 102 of the solar cell 100a illustrated in FIG. 1 with the first mesh layer 106a taking the role of the metal and where the semiconductor layer 102 includes n-Si.

When the nanotubes of the first mesh layer 106a and the n-Si are placed into contact, thermodynamic equilibration causes their Fermi-levels to align. This is accomplished by a transfer of electrons from the n-Si to the first mesh layer 106a. The result of this equilibration is shown in FIG. 2B. The electrons transferred from the n-Si conduction band result in a region of effectively intrinsic Si at the junction, which possesses no free carriers (i.e., no free electrons in the conduction band or holes (absence of electrons) in the valence band). This effectively intrinsic region is called the depletion region having a characteristic length called the depletion width. The width of the depletion region depends in part on the doping density of the semiconductor material in the semiconductor layer 102.

The additional potential energy of an electron in the region of this depletion layer is reflected in the band bending in the n-Si near the interface. Energetically, the free electrons in the bulk of the n-Si occupy a narrow strip just above the conduction band minimum. After the contact of the two materials is made the bent conduction band in the n-Si reflects an energy barrier that electrons in the conduction band of the n-Si (gray region to the right of the bent bands) must overcome to get from the n-Si to the first mesh layer 106a. The approximate height of this barrier is called the built-in-potential $V_{bi}$ and the magnitude of the built in potential (in the absence of surface states) is given by $V_{bi}=\phi_S-\phi_M$. The barrier for electrons going from the nanotubes to the n-Si is called the Schottky barrier and is approximately the difference between the original conduction band minimum in the n-Si and the Fermi level of the nanotubes. The junction of the two materials is called a Schottky junction.

As stated above, in the embodiment illustrated in FIG. 1, the first mesh layer 106a contacts the semiconductor layer 102. The junction of the first mesh layer 106a with the semiconductor layer 102 forms a Schottky junction 200 (i.e., a metal-semiconductor junction). FIGS. 2A and 2B are an energy band diagram illustrating energy levels of the Schottky junction 200 in the absence of a voltage applied by the gate voltage 120.

When a photon is incident onto a semiconductor, if the photon energy exceeds the bandgap energy of the semiconductor, the photon can be absorbed, with the energy going into the promotion of an electron from the valence band of the semiconductor to its conduction band (leaving behind a hole in the valence band). In the absence of other phenomena the electron will ultimately decay back to the valence band, the electron recombining with a hole, and the energy dissipated as radiation or lattice vibrations (heat). If, however the photon is absorbed within the depletion region of a nanotube/n-Si Schottky junction 200, or if the electron-hole pair generated by the photon outside the depletion region can diffuse into this region, then the band bending provides an electromotive force that sweeps electrons away from the Schottky junction 200, toward the bulk n-Si, while holes in the valence band are swept towards the nanotube side of the junction. In this manner the built-in potential resulting from the band bending powers the device to create a solar cell 100. The resulting device is a nanotube/n-Si Schottky junction 200 solar cell 100. The reported power conversion efficiency from such solar cells 100 is about 7%.

When the solar cell 100a illustrated in FIG. 1 is exposed to light (hv) as shown, the photons are transmitted through the first mesh layer 106a and absorbed within the underlying depletion region in the semiconductor layer 102. This absorption generates electron-hole pairs that are driven in opposite directions by the built-in potential $V_{bi}$. The holes are extracted in the first mesh layer 106a, and the electrons are extracted in the semiconductor layer 102.

In the absence of illumination (i.e., in the dark), when a voltage is applied to the Schottky junction 200, the Schottky junction 200 behaves as a diode. For example, when the Schottky junction 200 is forward-biased (i.e., a positive charge is applied to the first mesh layer 106a and a negative charge is applied to the semiconductor layer 102), the negative charge applied to the semiconductor layer 102 from the power supply raises and unbends the initially bent bands. As the bands approach the flat band condition, the barrier to transport across the Schottky junction 200 decreases and forward current can begin to flow, growing exponentially with further increases in the forward bias voltage. When reverse bias voltage is applied to the Schottky junction 200 (i.e., a negative charge is applied to the first mesh layer 106a and a positive charge is applied to the semiconductor layer 102) the further electrons withdrawn from the depletion region serves to increase the depletion region width, increases the amount of band bending and increases the barrier to transport so that only very small currents can flow in the reverse direction.

Figure 3:
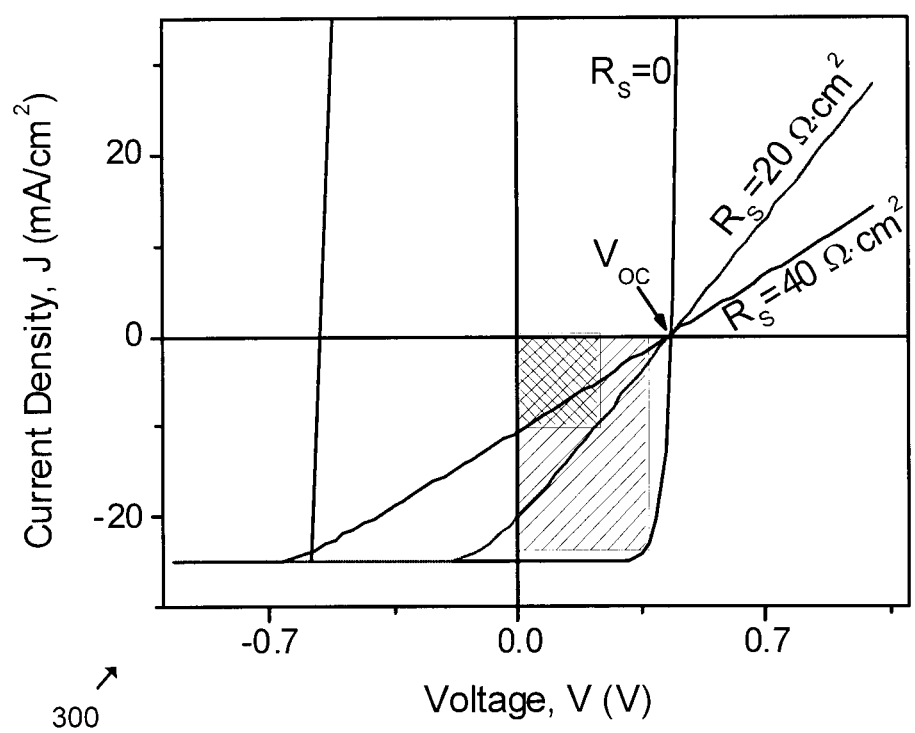
FIG. 3 is a graph of an example of simulated current density versus voltage (J-V) characteristics for an embodiment of the solar cell of FIG. 1 in accordance with various embodiments of the present disclosure.

The figures of merit for a solar cell 100 can be extracted from the current density—voltage plots of a solar cell 100 exposed to the solar spectrum at a standard illumination intensity. FIG. 3 is a graph 300 of a simulated current density versus voltage (J-V) plot for an embodiment of a solar cell 100 including a Schottky junction 200. The voltage represented on the x-axis is the bias voltage Vg applied to the illuminated solar cell 100 while the current density is the resulting current divided by the area of the illuminated junction of solar cell 100. The Prince model of the current density-voltage relation for a solar cell 100 includes series and shunt resistances. For typically attained values, the shunt resistance has a negligible effect on the J-V characteristic whereas the series resistance (Rs) has profound effects. FIG. 3 illustrates the J-V characteristics of three curves having different series resistances, $R_S=0$ ohms-cm$^2$, $R_S=20$ ohms-cm$^2$, and $R_S=40$ ohms-cm$^2$. $R_S=0$ ohms-cm$^2$ may be thought of as an ideal case, yielding maximum power, where power (i.e., P=IV) is indicated by the area of the boxes in the fourth quadrant (IV) of FIG. 3. The relative areas of the boxes associated with the different curves illustrate the deleterious effect of series resistance on the performance of a solar cell 100.

Figure 2:
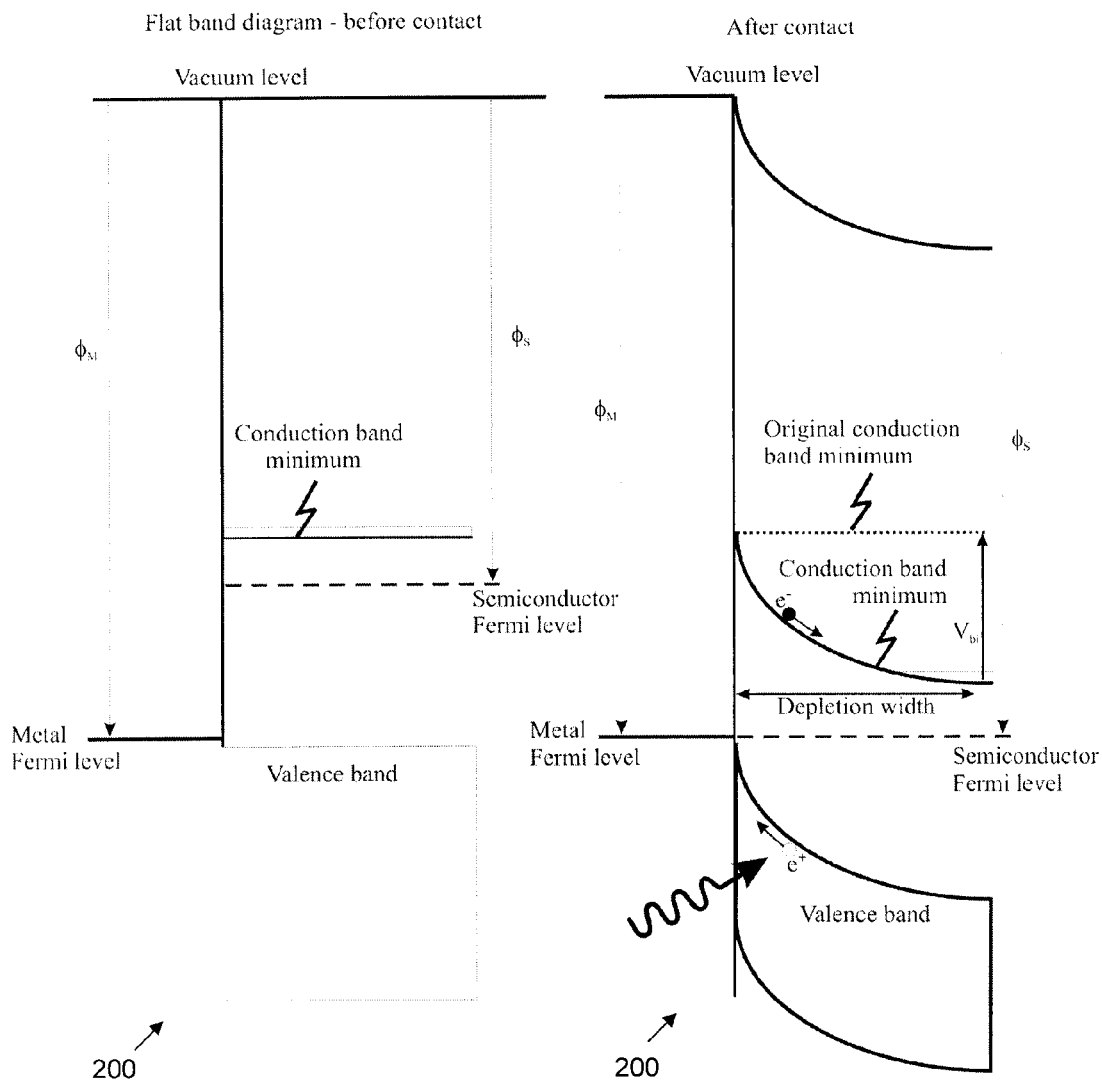
FIGS. 2A and 2B are examples of energy band diagrams illustrating the energy levels of the metal and the semiconductor included in the solar cell of FIG. 1 in accordance with various embodiments of the present disclosure.

For a solar cell 100 in the dark, the forward-electron current becomes appreciable when the applied forward bias voltage counteracts the built-in potential $V_{bi}$. Referring to FIG. 2, under these conditions, the energy bands in the semiconductor layer 102 are raised and flattened sufficiently to permit forward tunneling and thermionic currents, referred to as a forward-electron current. When the solar cell 100 is illuminated, the J-V curve additionally includes a counter-propagating photo-electron current. Referring to FIG. 3, the voltage at which the net current is zero corresponds to the applied bias voltage at which the forward diode current equals the photo-current flowing in the opposite direction. Since the forward current requires a flattening of the bands, while the electromotive force for photo-carrier separation is provided by the bent bands, the voltage at which these currents are equal, i.e., the open circuit voltage, $V_{OC}$, (approaching the flat band condition) provides a sensitive measure of the built-in potential.

Figure 4:
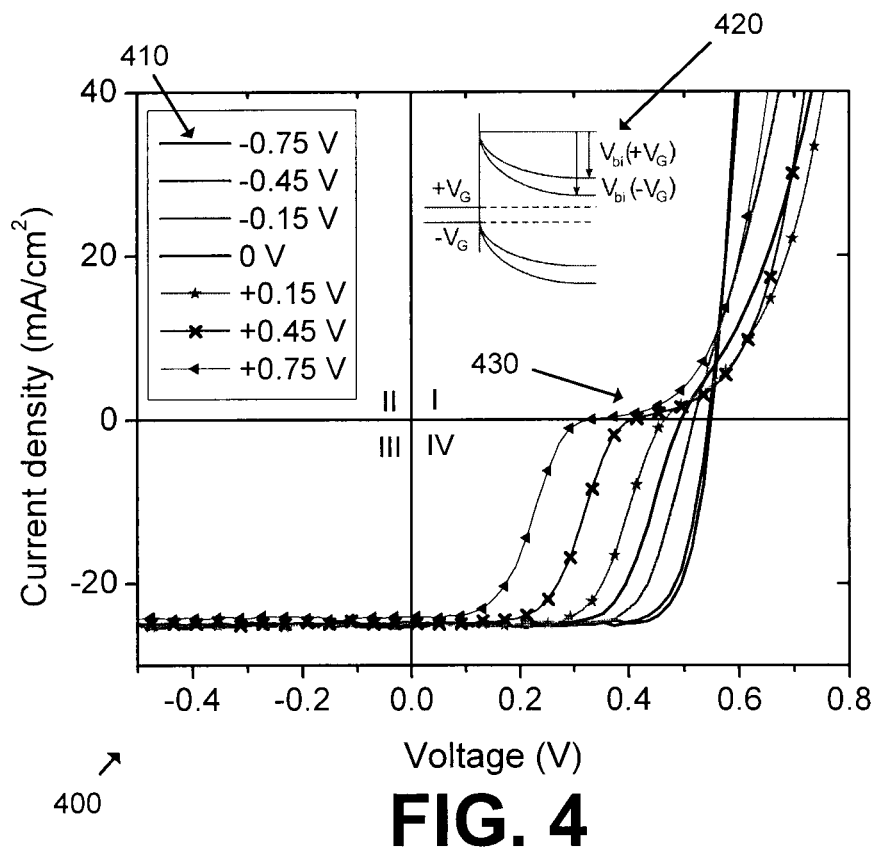
FIGS. 4 and 5 are graphs of an example of J-V characteristics measured on an embodiment of the solar cell of FIG. 1 while illuminated in accordance with various embodiments of the present disclosure.
Figure 5:
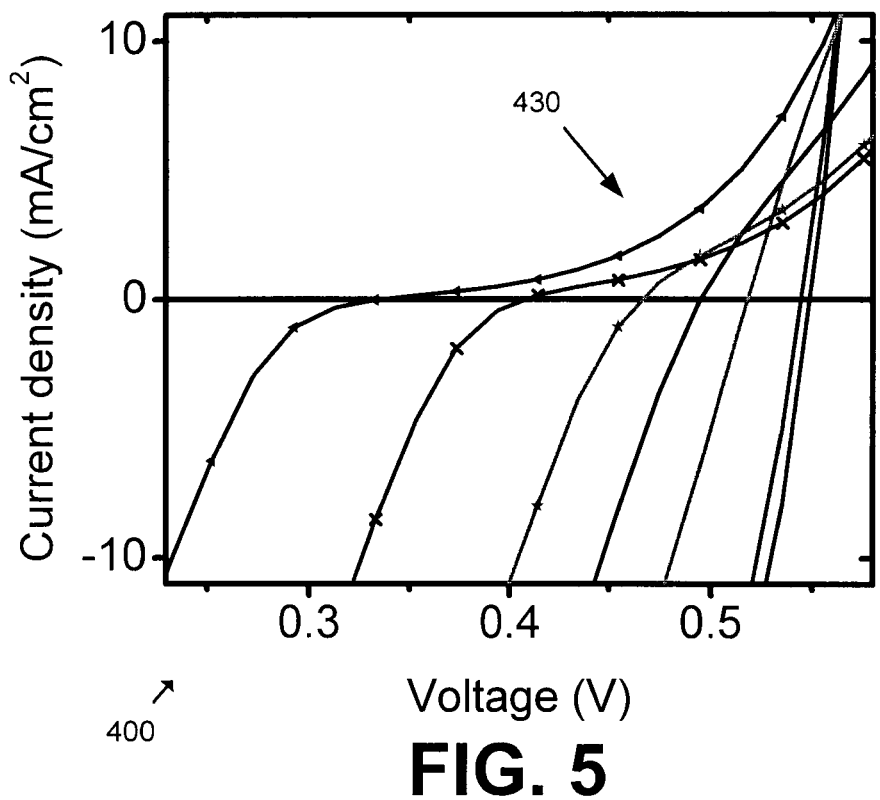

FIG. 4 is a graph 400 of current density versus voltage (J-V) measured on the embodiment of solar cell 100 illustrated in FIG. 1 at various biases for the gate voltage $V_G$ while the solar cell 100 is illuminated. The various biases for the gate voltage $V_G$ are indicated by the table inset 410 in FIG. 4. The voltage represented on the x-axis is the solar cell 100 bias voltage $V_B$. As can be seen in FIG. 4, when the voltage applied by the gate voltage $V_G$ is positive, the performance of the solar cell 100 is degraded and an increase in prominence of a "kink" (energy gap feature) 430 occurs when the solar cell bias voltage $V_G$ is close to or about 0 V (i.e., the open circuit voltage, $V_{OC}$). In contrast, negative voltages applied by the gate voltage $V_G$ enhance the performance of the solar cell 100 and reduce the prominence of the "kink" 430. FIG. 5 is a graph of the current density versus voltage (J-V) presented in FIG. 4, except over a narrower range of solar cell bias voltages $V_B$. Accordingly, FIG. 5 is essentially a magnified view of the open circuit voltages $V_{OC}$ illustrated in FIG. 4.

Table 1 below describes various solar cell 100a characteristics extracted from the J-V curves illustrated in the graphs 400 of FIGS. 4 and 5 at the different gate voltages. Since the formulas for calculating these various figures of merit are known to persons skilled in the art, an explanation of those formulas is omitted here for purposes of brevity.

TABLE 1

Solar cell characteristics from the gated J-V curves of FIGS. 4 and 5.

| | Gate Bias (V) | | | | | | |
|---|---|---|---|---|---|---|---|
| | −0.75 | −0.45 | −0.15 | 0.0 | +0.15 | +0.45 | +0.75 |
| $V_{OC}$(V) | 0.55 | 0.53 | 0.51 | 0.49 | 0.47 | 0.41 | 0.33 |
| $J_{SC}$(mA/cm$^2$) | 25.0 | 25.3 | 25.2 | 25.0 | 25.0 | 24.9 | 24.8 |
| FF | 0.79 | 0.77 | 0.71 | 0.68 | 0.62 | 0.54 | 0.44 |
| PCE(%) | 10.9 | 10.5 | 9.2 | 8.4 | 7.4 | 5.5 | 3.6 |

The changes in open circuit voltage $V_{OC}$ illustrated in FIGS. 4 and 5 are consistent with a change in built-in potential $V_{bi}$ indicated in the band diagram inset 420 in FIG. 4. As illustrated in the band diagram inset 420, negative gate voltages withdraw electrons from the first mesh layer 106a, causing the Fermi level of the first mesh layer 106a to shift further from the vacuum level relative to the semiconductor layer 102. The Fermi level equilibration results in a greater built-in voltage $V_{bi}$, reflected in a correspondingly greater open circuit voltage $V_{OC}$.

In addition to the changes in the built-in voltage $V_{bi}$ as the gate voltage $V_G$ changes, the series resistance $R_S$ changes as well. Specifically, as depicted in FIG. 4, the series resistance $R_S$ increases as the gate voltage $V_G$ increases, which is indicated by the more shallow slopes of the various curves at higher currents. This change in series resistance occurs due to electrolyte-induced changes in the first mesh layer 106a caused by the ionic conductor layer 108. The embodiment of the solar cell 100a measured includes a first mesh layer 106a that is one third metallic nanotubes and the remaining two thirds semiconducting nanotubes. Accordingly, the changes in series resistance occur as the Fermi levels of the nanotubes in the first mesh layer 106a are pushed by the gate voltage $V_G$ into (or out of) the band gap of the nanotubes, effectively switching off (or on) the conductance in the semiconducting nanotubes, which changes the resistivity of the first mesh layer 106a thus explaining the modified slopes in the "linear" regions of the various curves with the changing gate voltage $V_G$.

Neither a shift in built-in voltage $V_{bi}$ or a modified series resistance Rs can explain the low current "kink" 430 in FIG. 4 near $V_{OC}$ and its increasing prominence with increasing gate voltage $V_G$. However, this "kink" 430 can be explained in terms of the behavior of the first mesh layer 106a and the semiconductor layer 102 at their respective surfaces where each layer contacts the other. Schottky barrier models of a metal-semiconductor junction, which will be discussed in the following paragraphs, are useful for providing a foundational understanding of this "kink" 430.

According to the Schottky-Mott model of a Schottky junction 200 (discussed above), the built-in potential $V_{bi}$ depends only on the difference in the pre-contact Fermi-levels of the metal and the semiconductor according to the expression: $V_{bi}=\phi_S-\phi_M$. This model is only applicable to cases in which surface states can be ignored. According to the Bardeen model of a Schottky junction 200, at metal-semiconductor junctions, the termination of a bulk semiconductor material at its surface leads to surface states. Treated as a continuum, these states have their own energy dependent density of states, and the energy distribution of that density depends on the particular crystal face involved, surface atomic reconstruction, defects, and impurities. Because the bulk of a semiconductor material must be in thermodynamic equilibrium with its own surface, the spatial distribution of charge between the surface and the bulk can itself lead to an intrinsic band bending and associated depletion layer even before a metal is brought into contact with the semiconductor surface.

If the surface states have a band of high density around the highest occupied surface state, then thermodynamic equilibration with the Fermi level of the contacting metal in the metal-semiconductor junction occurs via electrons exchanged with this high density band of surface states. Accordingly, there is relatively little change in the band bending upon making the metal-semiconductor contact, and the Schottky barrier is independent of the work function of the metal in the metal-semiconductor junction, effectively "pinning" the Schottky barrier height and the built-in potential $V_{bi}$, independent of the metal contacted to the semiconductor.

The Schottky-Mott and Bardeen models comprise the opposite extremes of what occurs at Schottky junctions 200. To allow for a degree of dependence on the metal workfunction, modern Schottky barrier models incorporate the idea of surface states at the semiconductor surface and an additional interface dipole that occurs between the metal and charge transferred into these surface states upon contacting the semiconductor. The interface dipole may be associated with bond polarization across the chemical bonds between the metal and the semiconductor and/or the charge transferred by energy equilibration between surface states in the semiconductor and the metal. This interface dipole is assumed to be thin, and the dipole functions as a tunneling barrier whose effect is folded into the Schottky barrier height. The modern view of metal-semiconductor junctions thus allows for modulation of the built-in potential mediated by charge exchange with surface states, combined with an interface dipole that contributes to the Schottky barrier height.

Referring again to FIGS. 4 and 5, the "kink" 430 results from a gate-modulated enhancement and suppression of the interface dipole at the junction of the first mesh layer 106a and the semiconductor layer 102, which in turn feeds back to the band bending and built in voltage $V_{bi}$ at the junction. Because the electrolyte coupled to the gate voltage $V_G$ has direct access to the surfaces of the first mesh layer 106a and the semiconductor layer 102 due to the porosity of the first mesh layer 106a, the effect of the gate voltage $V_G$ on the interface dipole can be dramatic. At more positive gate voltage $V_G$ biases, the interface dipole is enhanced and contributes to the Schottky barrier height manifesting itself as a reduced forward current in the first quadrant (I). In the fourth quadrant (IV), the additional tunneling barrier due to this enhanced interface dipole increases recombination losses, manifesting itself as the reduced current "kink" 430. Further contributing to this barrier is an electric field induced across the depletion layer due to the positive charges accumulated in the ionic liquid in direct contact with the Si surface, between nanotubes (generatng an electric field in a direction opposing the field associated with the built-in potential). Switching to negative gate voltage $V_G$ biases reverses these trends.

As shown in FIGS. 4 and 5, the open circuit voltage $V_{OC}$ saturates at 0.55V with negative gate voltage $V_G$. This saturation may be due to a region of high surface state density, that once reached, prevents further change in the built-in potential $V_{bi}$.

Figure 6:
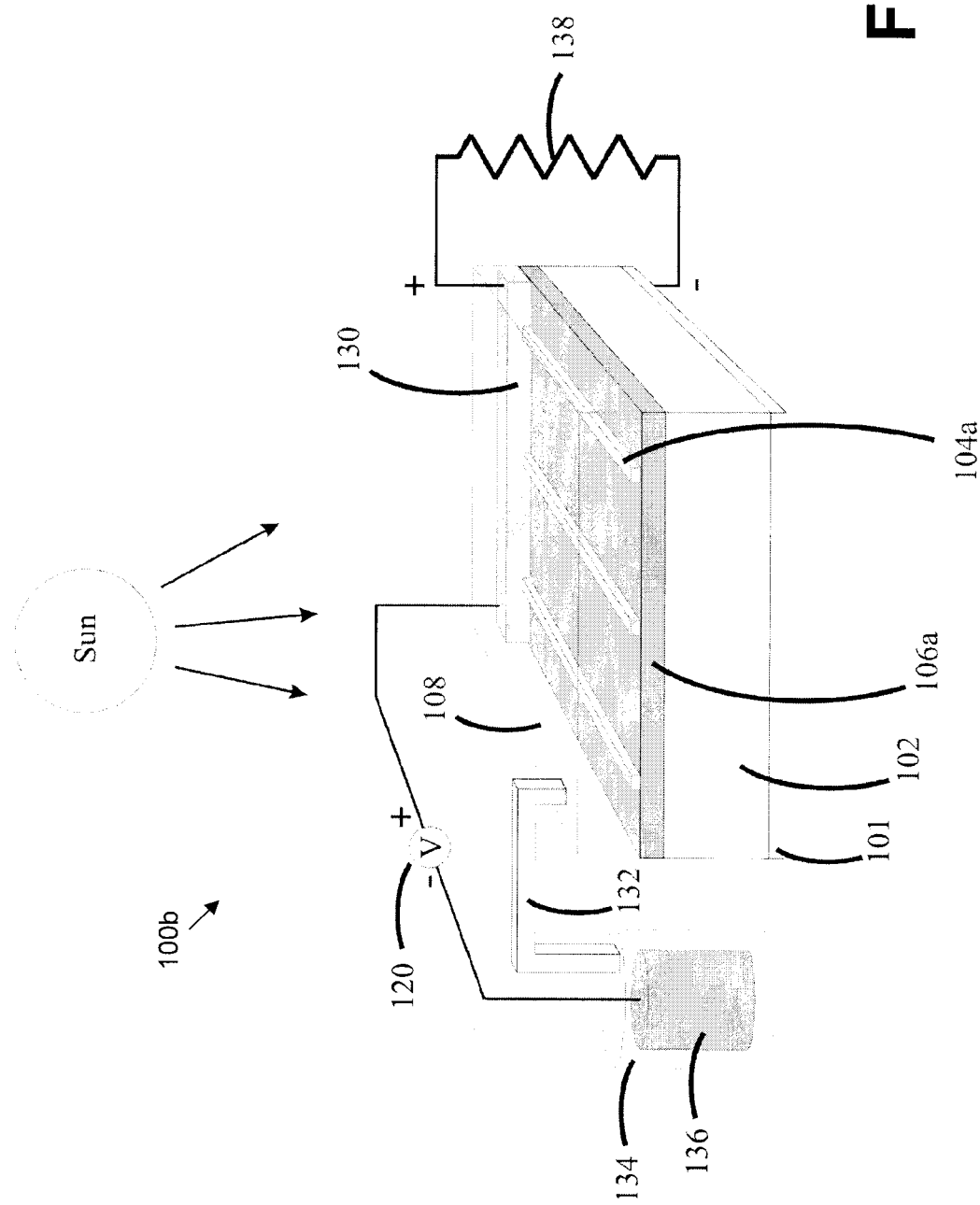
FIG. 6 is a graphical representation of another example of a solar cell in accordance with various embodiments of the present disclosure.

FIG. 6 is a perspective view of a nonlimiting embodiment of a solar cell 100. The embodiment of a solar cell 100 illustrated in FIG. 6, denoted as solar cell 100b, may be more useful for commercial applications than the embodiment illustrated in FIG. 1, denoted as solar cell 100a. Nonetheless, the solar cell 100b in FIG. 6 is similar to the solar cell 100a as will be discussed below, and the various materials discussed above with respect to the solar cell 100a may also be included in solar cell 100b.

The solar cell 100b includes a semiconductor layer 102 forming a Schottky junction 200 with an electrically conducting, optically transparent, porous mesh layer 106a including nanotubes. The semiconductor layer 102 has a back contact layer 101, which becomes the negative terminal of the solar cell 100b. At the face of the solar cell 100b to be exposed to solar radiation, a first metallization layer 104a (patterned in the form of metal finger electrodes, also denoted herein as finger electrodes 104a) couples electrically to the nanotubes of the first mesh layer 106a. The spacing between the finger electrodes 104a is determined by the trade-off between the deleterious amount of light that additional such finger electrodes 104a block from the semiconductor surface, and the increase in the cell series resistance that result as fewer such finger electrodes 104a are used.

The finger electrodes 104a are in turn coupled by thicker, but more widely spaced, perpendicular metal bus bars 130 that couple all the finger electrodes 104a electrically. The spacing of the bus bars 130 is again determined by the trade-off between the deleterious amount of light that more such bus bars 130 would block from the surface of the semiconductor layer 102 and the increase in the solar cell 100b series resistance that results as fewer such bus bars 130 are used. Any one or more of the metal bus bars 130 becomes the positive terminal of the solar cell 100b. Rather than overlie the first mesh layer 106a the metal finger electrodes 104a and the metal bus bars 130 may underlie the first mesh layer 106a. The metal finger electrodes 104a and bus bars 130 may stick better to the surface of the semiconductor layer 102 (or to a thin oxide layer that may underlie the metal finger electrodes 104a and bus bars 130 only) than they do to the nanotubes improving the integrity of the solar cell 100b. In that case the first mesh layer 106a, due to the flexibility of the nanotubes, will conform down to the surface of the semiconductor layer 102 around the finger electrodes 104a still forming the nanotube-semiconductor junction. In either case (nanotubes under or over the finger electrodes 104a and bus bars 130) the porous first mesh layer 106a is saturated to the surface of the semiconductor layer 102 with an optically transparent, ionically conducting material of the ionic conductor layer 108.

Proximate to the semiconductor layer 102, but not occupying any of its surface "real estate," is a can 134 within which lies a high surface area electrode 136 that is also saturated with the ionically conducting material of the ionic conductor layer 108. The high surface area electrode 136 can be any number of materials to include activated carbon, or a pseudocapacitive electrode of the type used in supercapacitors such as, for example, manganese oxide or vanadium oxic or mixtures of these and/or other such materials possessing a high half cell capacitance.

The ionic conductor layer 108 that saturates the first mesh layer 106a is ionically coupled to the ionically conducting material in the can 134 that saturates the high surface area electrode 136 via an ionically conducting bridge 132. A power supply 120 provides the small gate voltage of about 0.75 V between the metal bus bar 130 and the high surface area electrode 136 in a direction (the high surface area electrode made negative) that enhances the power conversion efficiency of the solar cell 100b. The power supply 120 that provides the gate voltage can itself be a small solar cell.

In view of at least the foregoing discussion, the present application describes various embodiments of a solar cell 100 having a built-in potential $V_{bi}$ that can be adjusted by electronic gating (i.e., changing a gate voltage $V_G$). Additionally, the electronic gating can modify the interface dipole at the interface between the first mesh layer 106a and the semiconductor layer 102 by partially emptying the surface states and thereby increasing $V_{bi}$, which enhances the solar cell 100 performance. Additionally, the ionic gating induces ions of the ionic material to arrange themselves at the semiconductor surface. For the proper sign of the gating, these ions can contribute to the electric field across the depletion layer in a direction that enhances the rate at which charge is swept out of the depletion layer thereby enhancing the solar cell performance.

For semiconductors that possess an intrinsically high surface state density within the semiconductor bandgap, the increases in $V_{bi}$ with gate voltage (of the appropriate sign) can saturate once the energy of high surface state density is reached. Modification of the surface of the semiconductor layer 102 either before or after the contact with the mesh layer 106 is made can modify the surface state density distribution to permit further increases in $V_{bi}$ (with gate voltage of the appropriate sign) with concomitant enhancement of the solar cell performance. Such modification can be induced mechanically, e.g., by abrasion, chemically or electrochemically by attachment of functional groups to the semiconductor surface, or by the deposition of species onto the surface by vapor or solution phase deposition. In the case of vapor phase deposition, a plasma enhancement may be useful.

Figure 7A:
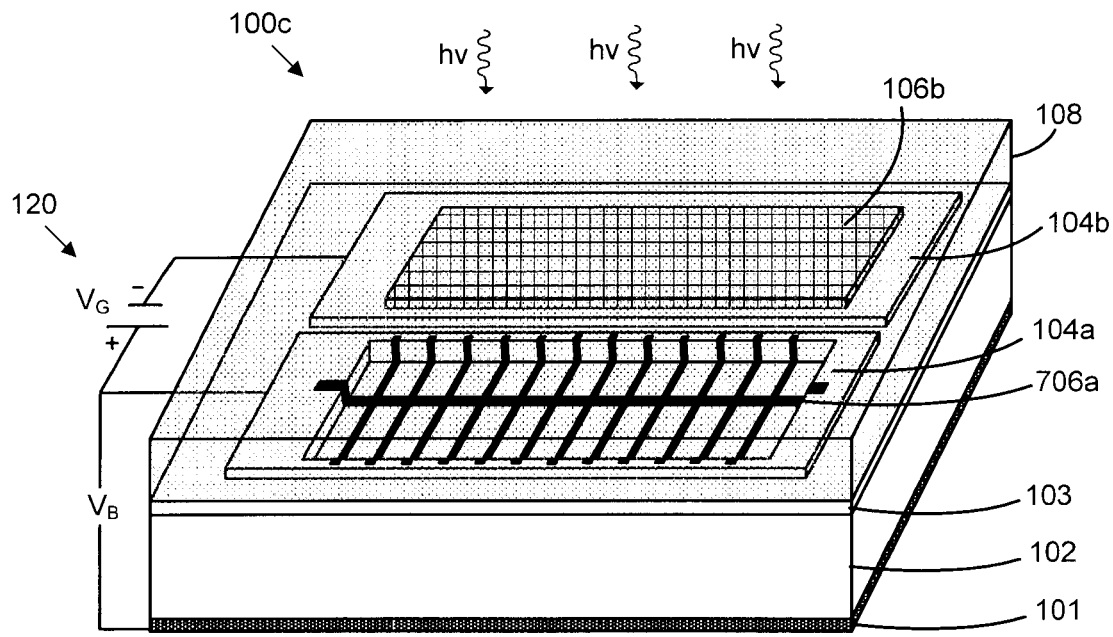
FIG. 7A is a graphical representation of another example of a solar cell in accordance with various embodiments of the present disclosure.

Referring next to FIG. 7A, shown is a perspective view of another nonlimiting embodiment, among others, of a solar cell 100, denoted as solar cell 100c. The solar cell 100c includes a back contact layer 101 and a semiconductor layer 102. The solar cell 100c further includes an insulating layer 103 on the semiconductor layer 102. A portion of the insulating layer 103 is etched to expose the semiconductor layer 102, which is surrounded by a first metallization layer 104a. Rather than a first mesh layer 106a as illustrated in FIG. 1, a grid layer 706a is placed on the etched portion such that the grid layer 706a contacts the semiconductor layer 102 and the first metallization layer 104a. The grid layer 706a is an electrically conducting grid that covers only a fraction of the semiconductor layer 102 accessible through the etched portion. For example, the grid layer 706a may cover, about 50% of the exposed semiconductor layer 102, about 33% of the exposed semiconductor layer 102, or about 25% of the exposed semiconductor layer 102. As can be understood, other fractional coverage may be utilized. While the embodiments of FIG. 7A illustrates a rectangular grid layer 706a, other geometric grids may be utilized as can be understood.

The grid layer 706a (and the mesh layer 106b) ncludes one or more of the following materials: single wall carbon nanotubes, double wall carbon nanotubes, multi-wall carbon nanotubes, graphene, semiconducting nanowires, metallic nanowires, a metallic grid or a semiconducting grid. Regardless of the material, the grid layer 706a, which is in contact with the semiconductor layer 102, may be sufficiently transparent to the solar radiation that the major fraction of the radiation passing through the grid layer 706a reaches the surface of the semiconductor layer 102. The grid layer 706a is furthermore electrically conducting. Additionally, the grid layer 706a may be sufficiently porous to permit access of the ionic conductor layer 108 to both the surface of the semiconductor layer 102 and the portions of the grid layer 706a that contact the surface of the semiconductor layer 102.

The solar cell 100a further includes a second metallization layer 104b on the insulating layer 103. A mesh layer 106b contacts the second metallization layer 104b. The grid layer 706a and mesh layer 106b are electrically isolated from each other. The first metallization layer 104a forms a contact for the grid layer 706a, and the second metallization layer 104b forms a contact for the mesh layer 106b. Also, the grid layer 706a contacts the semiconductor layer 102 whereas the mesh layer 106b is isolated from the semiconductor layer 102 by the insulating layer 103. The grid layer 706a and first metallization layer 104a collectively form a junction electrode. Similarly, the mesh layer 106b and the second metallization layer 104b collectively form a gate electrode.

Figure 7B:
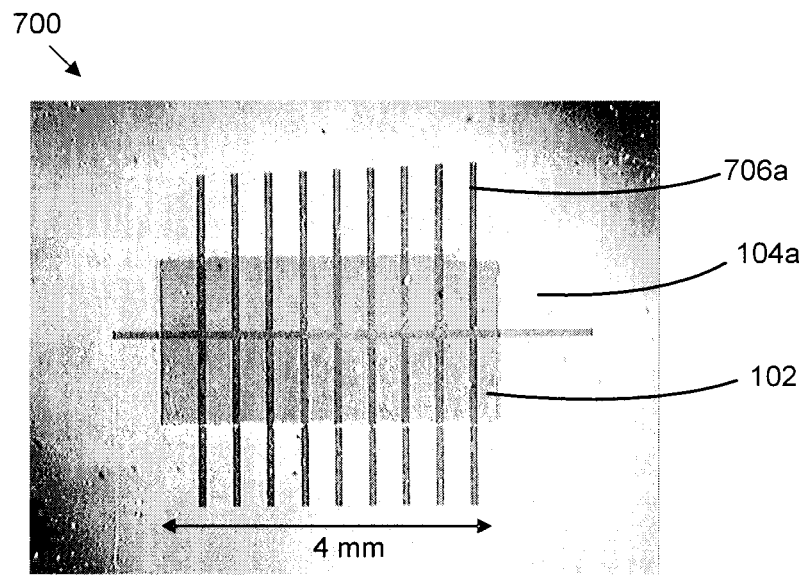
FIG. 7B is a picture of a grid layer of the solar cell of FIG. 7A in accordance with various embodiments of the present disclosure.

FIG. 7B is a picture 700 of an example of a grid layer 706a placed on an etched portion of the insulating layer 103 such that the grid layer 706a contacts the semiconductor layer 102 and the first metallization layer 104a. For example, a gold contact layer 104a with a 2×4 mm² rectangular window was evaporated onto a 1 µm thick oxide layer 103 on an n-Si wafer 102. The gold metallization layer 104a was used as an etch mask to etch the oxide insulating layer 103 within the window down to the bare Si layer 102 surface. A 45 nm thick, 6×8 mm² rectangular area thin, porous single wall carbon nanotube (SWNT) film was transferred across the window contacting the gold and forming the junction with the exposed n-Si semiconductor layer 102. This SWNT film was defined by standard photolithography and etching in oxygen plasma to create the grid pattern shown in FIG. 7B. The lines of the grid layer 706a are about 100 µm wide with about 300 µm spacing between adjacent lines. A second gold metallization layer 104b and a SWNT mesh layer 106b were deposited on the oxide insulating layer 103 near the junction. This mesh layer 106b and second metallization layer 104b collectively form the gate electrode once the electrolyte was added.

Figure 8:
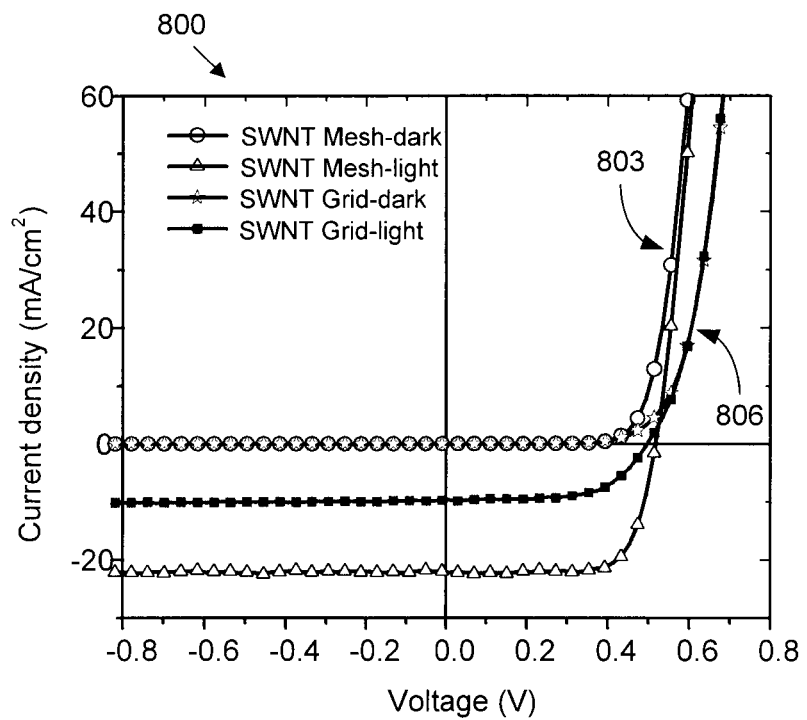
FIG. 8 is a graph of an example of J-V characteristics while dark and illuminated for an embodiment of the solar cell of FIG. 1 without an ionic conductor layer and an embodiment of the solar cell of FIG. 7A without an ionic conductor layer in accordance with various embodiments of the present disclosure.

Referring to FIG. 8, shown is a plot 800 illustrating cell current density versus voltage (J-V) characteristic in the dark and under illumination (AM1.5G, 100 mW/cm²) for two distinct devices in the absence of electrolyte (i.e., without ionic conductor layer 108). A first solar cell device utilizes a first SWNT mesh layer 106a (FIG. 1) across the entire window (see curves 803) and the second solar cell device includes a SWNT grid layer 706a (FIG. 7A) limiting the Si coverage with the nanotube lines to about 27% of the window area (see curves 806). The nanotube film/n-Si contact forms a "conventional" metal-semiconductor Schottky junction solar cell. Fermi level equilibration of the n-Si with the nanotubes, transfers electrons from the n-Si to the SWNTs generating a depletion layer and band bending in the Si semiconductor layer 102, in the vicinity of the nanotubes in the grid layer 706a. Photons absorbed in the Si generate electron-hole pairs that are separated by the built-in potential $V_{bi}$, enabling power generation from the solar cell device. For our doping density of about $10^{15}$ donors/cm³, this depletion layer extends ≤1 µm into the Si semiconductor layer 102 from the contact with the nanotubes. Given the relatively small extent of this depletion layer, the reduced junction area of the grid layer 706a yields a reduced short circuit photocurrent. This reduction in the photocurrent does not scale in direct proportion to the reduced junction area because high quality single crystal silicon has long diffusion lengths, allowing photocarriers generated far from the junction to diffuse there and contribute to the photocurrent. Nevertheless, the photocurrent in the device including the grid layer 706a is reduced by more than a factor of two over that of the device including the first mesh layer 106a, yielding a corresponding decrease in the full window-area-normalized power conversion efficiency.

Figure 9:
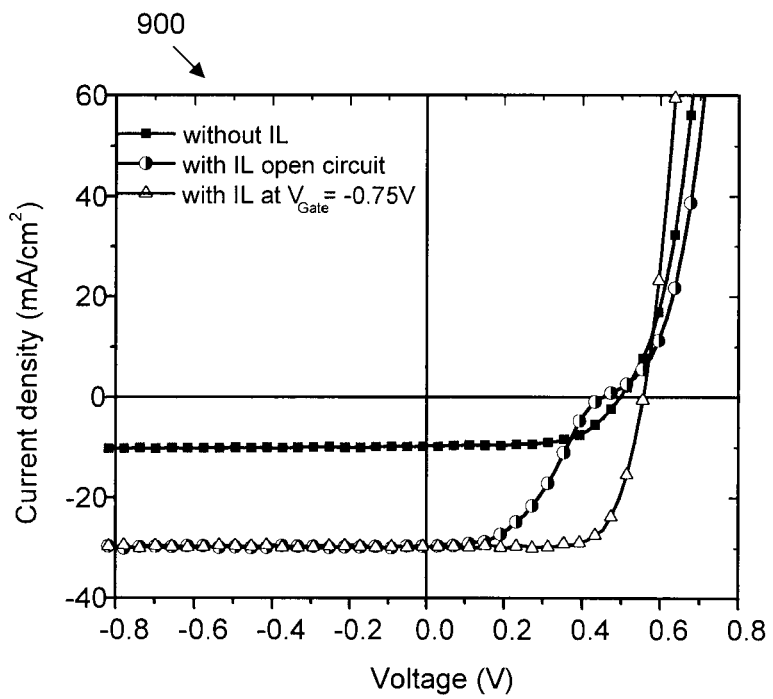
FIG. 9 is a graph of an example of J-V characteristics an embodiment of the solar cell of FIG. 7A without and with an ionic conductor layer in accordance with various embodiments of the present disclosure.

With the addition of the 1-Ethyl-3-methylimidazolium bis (trifluoromethylsulfonyl)imide (EMI-BTI) ionic liquid (IL) electrolyte as the ionic conductor layer 108, the solar cell behavior changes significantly. FIG. 9 is a graph 900 that compares the illuminated J-V curves of a solar cell device utilizing a grid SWNT layer 706a (FIG. 7A) before and after addition of the IL electrolyte as the ionic conductor layer 108, with the gate electrode electrically floating. Also shown in FIG. 9 is the case with −0.75 V applied to the gate electrode relative to the SWNT-grid junction electrode. The simple addition of the IL electrolyte (gate floating or not) more than recovers the short circuit photocurrent lost to the reduced area coverage of the n-Si by the nanotubes in the grid layer 706a. The electrolyte induces its own depletion (or inversion) layer in the Si semiconductor layer 102 across the large gaps between the nanotube lines of the grid layer 706a.

The nanotube-electrolyte/n-Si solar cell 100c is distinguished from photoelectrochemical cells in that there is no redox couple and the EMI-BTI electrolyte was selected for the ionic conductor layer 108 because of its very broad electrochemical window ranging from −2.6V to +2.0 V (vs. Fc/Fc+i.e. centered at −5.1 V relative to the vacuum level). Thus, the EMI-BTI electrolyte does not participate in the charge transport. Instead, photogenerated holes that make it to the electrolyte induced inversion layer in the Si semiconductor layer 102 are trapped by the electric field within the inversion layer and diffuse along it until they encounter a nanotube grid line where they are collected. Because the electric field, which accumulates holes at the surface, also repels electrons, deleterious surface recombination is largely avoided.

The situation is reminiscent of so called "grating" metal-insulator-semiconductor (MIS) cells, where narrow metal lines (Al or Mg) on the front surface of p-type silicon collected electrons trapped by an inversion layer formed at the p-Si surface in the regions between the widely spaced metal lines. The inversion layer in those devices was induced by positive charge trapped in a SiO layer grown on the Si layer. In the present case, the gate voltage is certainly capable of inducing charge (of either sign depending on the polarity of the gate) adjacent to the surface of the n-Si but interestingly the high short circuit current ($V_{Bias}=0V$) seen in the grid layer of FIG. 9 occurs immediately on introduction of the ionic liquid (IL) electrolyte as the ionic conductor layer 108. This implies that negative ions accumulate at the n-Si surface upon simple introduction of the IL electrolyte.

Figure 10A:
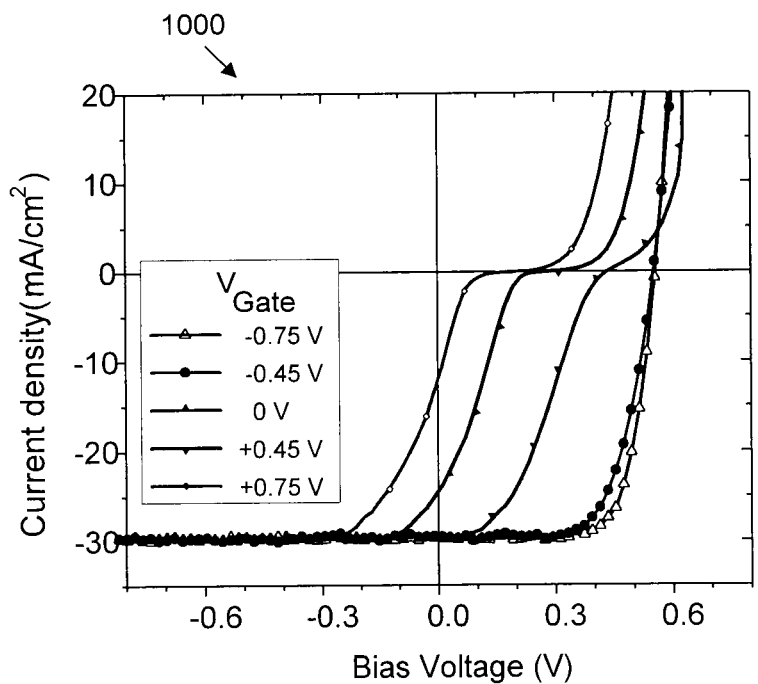
FIG. 10A is a graph of an example of experimental J-V characteristics an embodiment of the solar cell of FIG. 7A in accordance with various embodiments of the present disclosure.

To determine if such charge separation can be explained by the native electrostatics, the system was modeled using the a device simulation package: Synopsys® TCAD Sentaurus. To simulate the effect of the electrolyte, the program's ability to simulate dielectric coatings was using as proxy for the electrolyte. A dielectric coating was used with the very large dielectric constant ($\in=5000$), i.e. the mobile free ions of the electrolyte are replaced by a "dielectric" layer having a bound charge possessing an extreme polarizablity (the free charge of electrolytes precludes definition of a real DC dielectric constant for them so that the AC dielectric constants available in the literature are not relevant). The value of $\in=5000$ comes from the ratio of a characteristic dielectric layer length (about 100 µm) relative to that of the characteristic Debye layer dimension in the electrolyte (<20 nm). The simulation confirmed the formation of an inversion layer generating an electric field upon addition of the electrolyte. FIG. 10A shows a graph 1000 of the experimental J-V curves for the grid layer solar cell device 100c (FIG. 7A) where the current density remains normalized to the full window area.

Figure 10B:
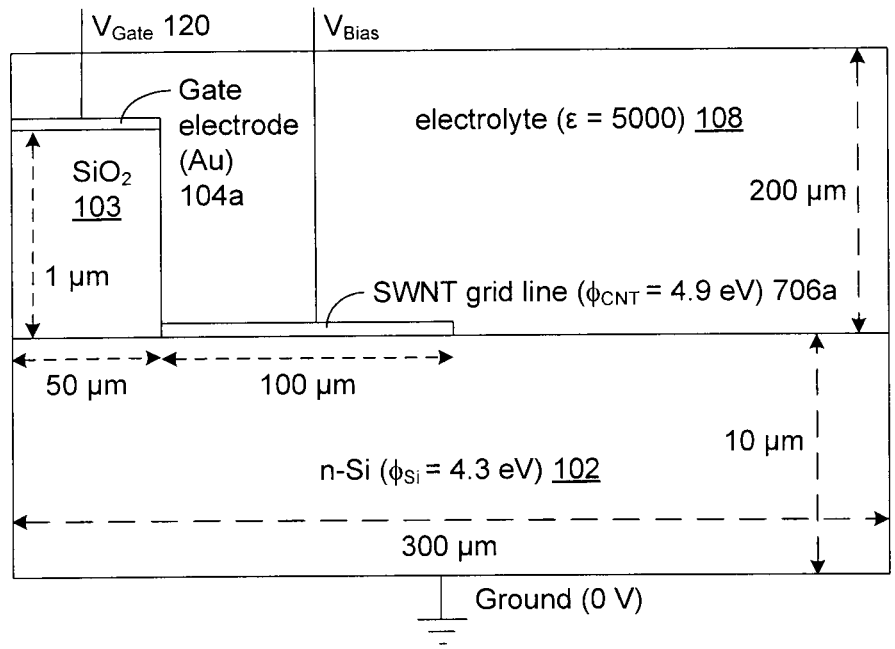
FIG. 10B is a graphical representation of the simulation parameters and geometry of the solar cell of FIG. 7A in accordance with various embodiments of the present disclosure.

FIG. 10B shows the simulation parameters and geometry (not to scale) for a cross-sectional slice through a SWNT grid line of 100 µm width, having its long axis perpendicular to the page. The SWNT line is treated as a simple metal of constant work function $\phi_{CNT}=-4.9$ eV (consistent with that of nitric acid purified SWNTs). The gate electrode is a gold line ($\phi_{Au}=-5.1$ eV) situated on a 1 µm thick SiO$_2$ dielectric ($\in=3.9$). Below the SWNT grid line lies the junction with the n-Si ($\phi_{Si}=-4.3$ eV for the $1\times10^{15}$ cm$^{-3}$ phosphorous doping density), which adjacent to the SWNT line is in direct contact with the "electrolyte" (dielectric with $\in=5000$) that coats the entire structure. The Neumann boundary conditions used place mirror planes at the left and right sides of the figure making the gold gate electrode line, including its reflection on the left side, 100 µm wide (equal area to the SWNT grid line) and the spacing to the next SWNT grid line, including the reflection on the right side, 300 µm.

Figure 10C:
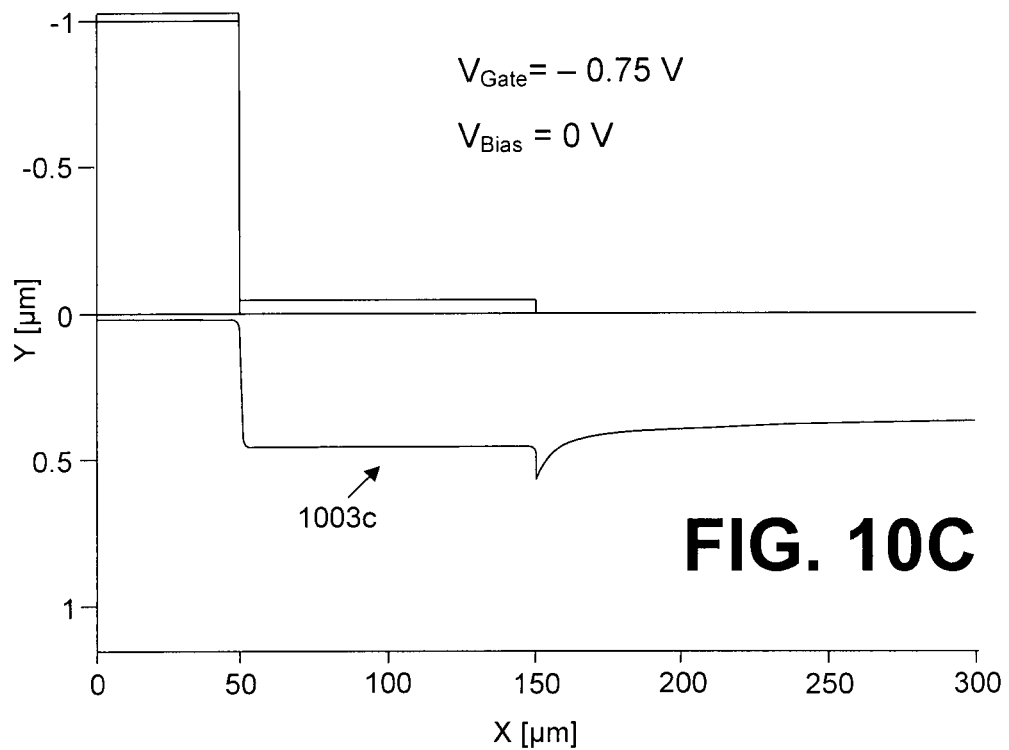
FIGS. 10C-10H are graphical representations illustrating examples of the electric field developed in the depletion layer of the solar cell of FIG. 7A in accordance with various embodiments of the present disclosure.
Figure 10D:
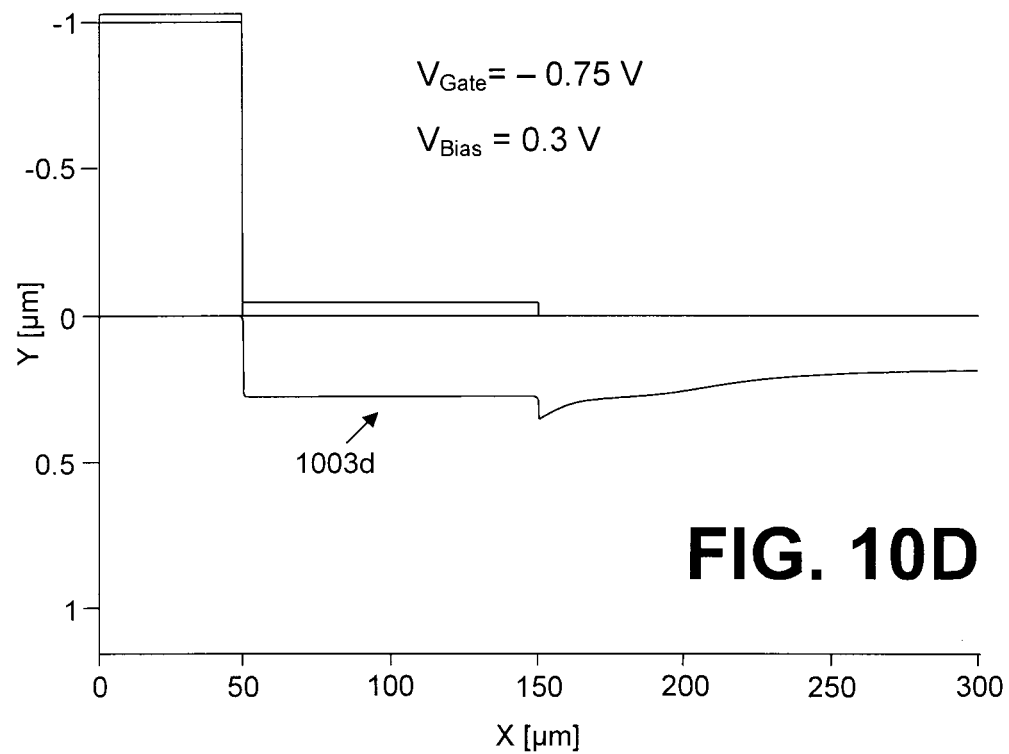
Figure 10E:
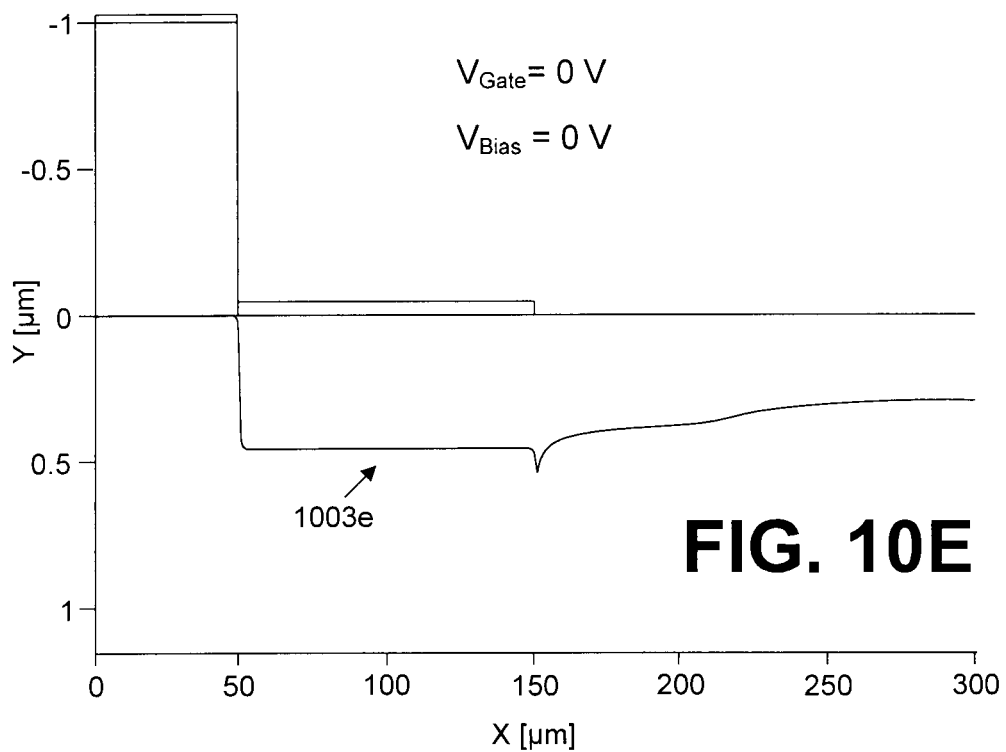
Figure 10F:
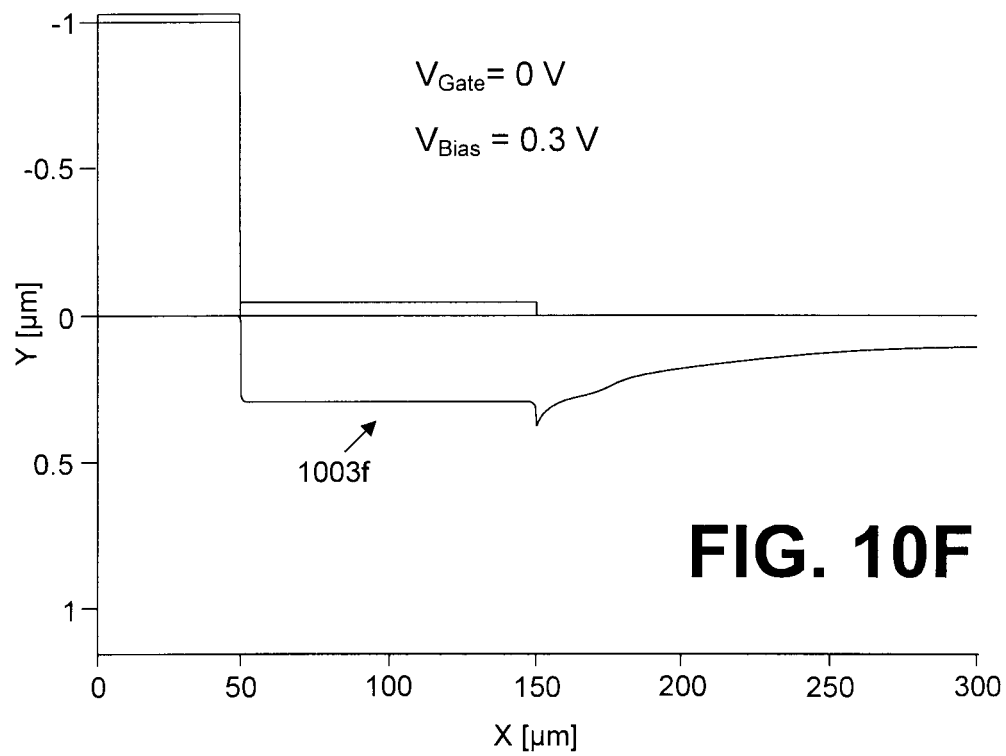
Figure 10G:
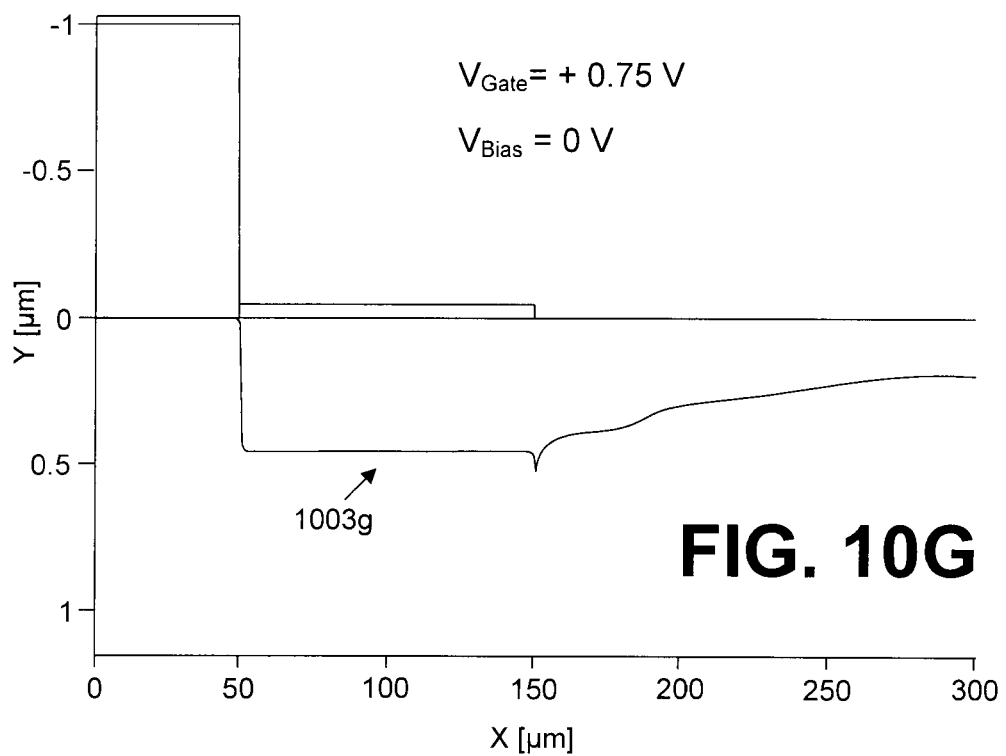
Figure 10H:
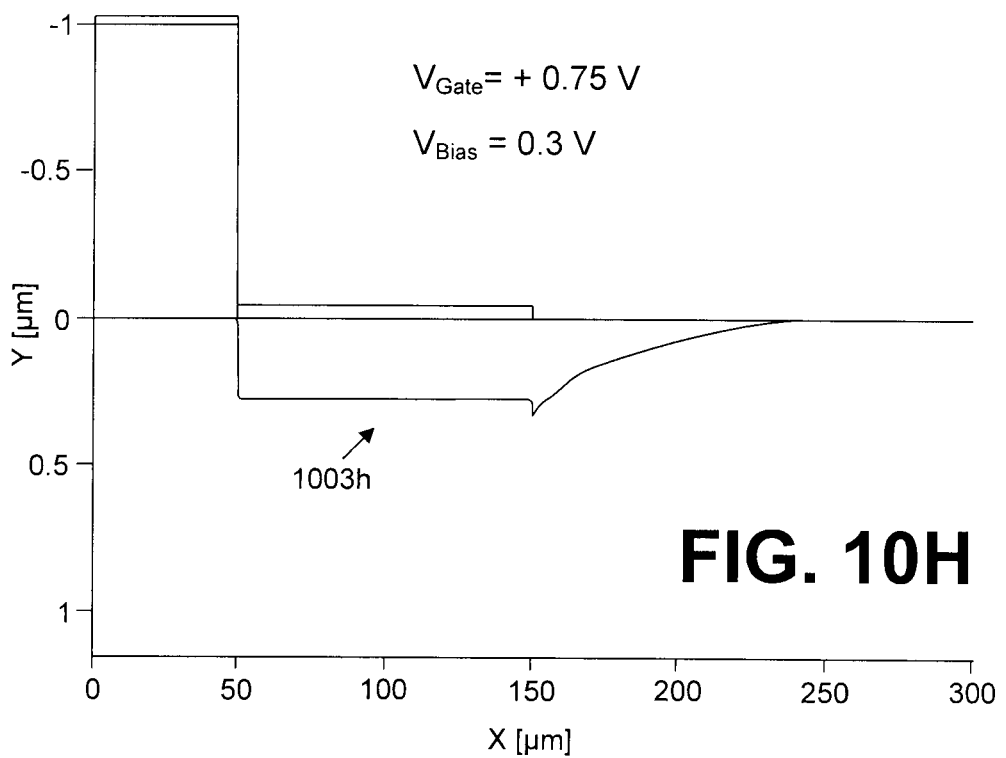

FIGS. 10C, 10E, and 10G are graphical representations illustrating the electric field developed in the depletion layer below the SWNT/n-Si junction and in the adjacent n-Si at a bias voltage $V_{Bias}=0$ V for gate voltages: $V_{Gate}=-0.75$, 0, +0.75 V (1003c, 1003e, and 1003g of FIGS. 10C, 10E, and 10G, respectively). FIGS. 10D, 10F, and 10H are graphical representations illustrating this at a forward bias voltage $V_{Bias}=0.3V$ for the same gate voltages: (1003d, 1003f, and 1003h of FIGS. 10D, 10F, and 10H, respectively). These results clearly show an electric field 1003 at the silicon surface that extends over the long 300 µm spacing between the neighboring SWNT grid lines. The simulation moreover shows that this field 1003 decreases as $V_{Gate}$ progressively increases from −0.75, to +0.75 V (FIGS. 10C to 10H), consistent with the smaller measured currents at $V_{Gate}=+0.75V$ and $V_{Bias}=0V$ as shown in FIG. 10A.

The simulation is focused on the inversion layer generated by the electrolyte and no attempt was made to model the other gate field dependent features of the J-V curves. Thus, the model does not for example include the gate induced shift in the SWNT Fermi-level. Nor does it incude the resistivity changes in the SWNT film, irrelevant to the electrostatics. Nevertheless, the model captures the existence of an inversion layer extending well beyond the direct depletion layer in the vicinity of the SWNT/n-Si contact and thus explains the increased saturation currents upon addition of the IL electrolyte.

This behavior can be qualitatively understood as follows. When the nanotube grid layer 706a and the n-Si semiconductor layer 102 are first placed in intimate contact the free energy of electrons in the n-Si (work function: $\phi_{Si}=-4.3$ eV) is reduced by their transfer to the carbon nanotubes (work function: $\phi_{CNT}=-4.9$ eV). Such transfer stops when Coulombic restoring forces due to the charge imbalance raise the local potential (the built in potential $V_{bi}$) to prevent further charge exchange, establishing equilibrium. In the presence of electrolyte ions, the ions are free to migrate to compensate the transferred charge and thus permit the exchange of substantially more charge before the equilibrium is reached. Additional electrons are transferred to the nanotubes from the Si regions between the nanotube grid lines of the grid layer 706a compensated by positive electrolyte ions surrounding the nanotubes, while the positive charge left behind in the n-Si inversion layer is compensated by negative electrolyte ions accumulated at the Si layer 102 surface. The electrolyte here serves much as it does in an electrolytic capacitor to raise the capacitance of the system with a self potential provided internally by the original Fermi level offset between the nanotubes and the n-Si, or externally by the gate field. These results also prompt further consideration of the cause(s) of the increasing energy gap-like feature (observed near the $V_{OC}$) with increasing gate voltage.

Once charge reorganization in the electrolyte of the ionic conductor layer 108 due to an applied gate field is complete, the gate circuit draws negligble current and so consumes negligible power. Hence the gate field enhancement of this inversion layer between the nanotube grid lines of the grid layer 706a has little energetic penaty. Indeed, compared to the first mesh layer 106a (FIG. 1) case, it has benefit. Photons in transit to the Si semiconductor layer 102 surface that are absorbed in the SWNT mesh layer 106a do not contribute to the power generation. This has been confirmed by placing a filter in the light path that only transmits light energies belowthe silicon bandgap. If the nanotubes participated in the photogeneratbn, the semiconducting nanotubeswith bandgaps of about 0.6 eV should have yielded some photocurrent, however none was observed. Since they don't contribute to the power generated, thinner nanotube films would absorb less light, allowing transmission of more power to the silicon, thereby enhancing the PCE. However, thinning the nanotube films increases their resistance in a non-linear fashion, introducing detrimental series resistance. The ability to use a liquid junction and reduce the area of the Si semiconductor layer 102 that must be covered by the nanotube mesh layer 106a suggested that a grid pattern of optimized spacing could minimize the overall absorptive losses while minimally increasing the series resistance, yielding a net gain in the PCE. This turns out to be the case. The SWNT mesh layer 106a achieved a best PCE of 10.9% at a $V_{Gate}=-0.75$ V. At this same gate voltage, the grid layer 706a having the geometry shown in FIGS. 7A-7B attains a PCE of 12%, an improvement of 10% over the mesh layer 106a configuration of FIG. 1.

Compared to the case of a continuous film, the increased solar flux arriving at the electrolyte/n-Si junction of the grid cell should manifest itself as a larger short circuit current density. The short circuit current density for the mesh layer 106a was $J_{scm}=25.0$ mA/cm$^2$, while that for the grid layer 706a was a larger $J_{SCG}=29.8$ mA/cm$^2$, as expected. Furthermore, if the only difference in the short circuit current of a device with a grid layer 706a and a device with a mesh layer 106a (both coated with IL electrolyte) lies in the absorptive losses due to the relative areas covered by the nanotubes, it should be possible to semi-empirically calculate the ratio of the current densities obtained in the two cases from considerations of only the relative solar power absorbed within the silicon in the two cases. The latter can be determined from measurements of the reflectance of silicon, the reflectance of a nanotube film on silicon and the transmittance of a nanotube film, on glass (ionic liquid coated in all cases) recorded over the relevant range of the solar spectrum (300 nm-1107 nm). The ratio of the measured current densities is $J_{SCG}/J_{scM}=29.8$ mA/25 mA=1.19, while the calculation yields 1.17 which is excellent agreement given no adjustable parameters and errors to be expected from neglect of the second transit through the nanotubes that appears in the reflectance measurement, and neglect of the reflection from the front surface of the nanotube film/ionic liquid occurring in the transmittance measurement. Reassuringly, correction for these effects would raise the calculated value, further improving the agreement.

Although the PCE of grating MIS cells could exceed 17%, it was found that they degraded rather drastically with time. The degradation was traced to electrons that accumulated from the environment at the SiO layer surface. Because this charge tended to neutralize the trapped positive charge in the SiO layer (responsible for generating the inversion layer that permitted the wide electrode spacing) the magnitude of the inversion layer decreased, degrading the solar cell performance. The use of electrolytes, which are intrinsically neutral and induce the inversion layer via a spontaneous charge separation, may eliminate this problem. As is seen in the data of FIG. 9, simple addition of the electrolyte as the ionic conductor layer 108, even with the gate electrically floating, yields a short circuit photocurrent equal to the saturation photocurrent implying existence of the inversion layer even before any gate field is applied. In the case of SWNTs, the appearance of the gap like feature on electrolyte addition reduces the fill factor so that the gate field is necessary to achieve the maximum power conversion efficiency. Such gap like feature is not anticipated in the case of conventional metal electrodes. In that case, a grating MIS Schottky junction solar cell with the SiO layer replaced by the ionic liquid electrolyte may provide the solution to the previous degradation problem even without the need for active gating (while gating incurs little energetic penalty, it does add to the device complexity). Finally, such solar cells may also benefit from a texturing of the Si semiconductor layer 102 to trap more of the light that would otherwise be reflected from its surface. Recently arrays of nanoholes in a p-n junction Si solar cell have been demonstrated to enhance the device performance. The large spacing permitted between the grid lines of the grid layer 706a in the electrolyte coated solar cell 100c indicates that substantial benefits of both the inversion layer and the additional light trapping may be achieved by filling the nanoholes with electrolyte.

It should be emphasized that the above-described embodiments are merely possible examples of implementations set forth for a clear understanding of the principles of the disclosure. Many variations and modifications may be made to the above-described embodiments without departing substantially from the spirit and principles of the disclosure. All such modifications and variations are intended to be included herein within the scope of this disclosure and the present application.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual no/concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

The invention claimed is:

1. A solar cell comprising:
   a semiconductor layer having a first side and a second side;
   a first mesh layer formed on the first side of the semiconductor layer, wherein the first mesh layer includes a porous mesh of nanotubes;

a first metallization layer in direct contact with at least a portion of the first mesh layer;
an electrode coupled to the first metallization layer by a gate voltage source;
a second metallization layer disposed on the second side of the semiconductor layer; and
an ionic layer,
wherein the electrode is physically separated from the first metallization layer and the second metallization layer, such that the electrode is in electrical communication with the first mesh layer via the ionic layer.

2. The solar cell of claim 1, wherein a built-in potential of a junction of the first mesh layer and the semiconductor layer is responsive to a voltage applied by the gate voltage source.

3. The solar cell of claim 1, wherein an interface dipole a junction of the first mesh layer and the semiconductor layer is responsive to a voltage applied by the gate voltage source.

4. The solar cell of claim 1, wherein the gate voltage source includes a plurality of solar cells.

5. The solar cell of claim 1, wherein the first metallization layer forms a first electrode and the electrode forms a second electrode isolated from the semiconductor layer.

6. The solar cell of claim 1, wherein the first metallization layer is insulated from the semiconductor layer by an insulating layer.

7. The solar cell of claim 1, wherein the first metallization layer directly contacts the semiconductor layer.

8. The solar cell of claim 1, wherein the first mesh layer includes a graphene layer.

9. The solar cell of claim 1, wherein the first mesh layer includes semiconducting nanowires.

10. The solar cell of claim 1, wherein the first mesh layer includes metallic nanowires.

11. The solar cell of claim 1, wherein a series resistance of the solar cell is responsive to a voltage applied by the gate voltage source.

12. The solar cell of claim 1, wherein the first mesh layer includes a metallic grid.

13. The solar cell of claim 1, wherein the first mesh layer includes a semiconductor grid.

14. A solar cell comprising:
an article, comprising:
a first mesh layer comprising a porous mesh of nanotubes;
a semiconductor layer, wherein at least a portion of the semiconductor layer is positioned to form a Schottky junction with at least a portion of the first mesh layer;
a first metallization layer electrically coupled to the first mesh layer;
a second metallization layer electrically coupled to the semiconductor layer; and
an ionic conductor layer; and
an electrode physically separated from the article, wherein the electrode is electrically coupled to the first metallization layer or the second metallization layer by a voltage source, and wherein the electrode is coupled to the first mesh layer and/or the semiconductor layer by the ionic conductor layer.

15. The solar cell of claim 14, wherein the ionic conductor layer does not participate in reduction-oxidation reactions during operation of the solar cell.

16. The solar cell of claim 14, wherein a surface of the semiconductor layer has been modified to change a surface state density, thereby increasing a range of a built-in potential responsive to a voltage applied by the voltage source.

17. The solar cell of claim 14, wherein the solar cell generates power when a surface of the semiconductor layer is illuminated by solar radiation.

18. The solar cell of claim 14, wherein the first mesh layer is transparent.

19. The solar cell of claim 14, wherein the first mesh layer is sufficiently porous to permit access of the ionic conductor layer to both a surface of the semiconductor layer and portions of the first mesh layer that contact the surface of the semiconductor layer.

20. The solar cell of claim 16, wherein the semiconductor surface has been modified after the first mesh layer is formed on the semiconductor layer.

* * * * *

UNITED STATES PATENT AND TRADEMARK OFFICE
CERTIFICATE OF CORRECTION

PATENT NO. : 9,331,217 B2
APPLICATION NO. : 13/580205
DATED : May 3, 2016
INVENTOR(S) : Andrew Gabriel Rinzler et al.

Page 1 of 1

It is certified that error appears in the above-identified patent and that said Letters Patent is hereby corrected as shown below:

Is the Claims:

Claim 3, at column 17, line 15, after the word "dipole" insert the word --of--.

Signed and Sealed this
Second Day of August, 2016

Michelle K. Lee
*Director of the United States Patent and Trademark Office*